(12) United States Patent
Ling

(10) Patent No.: US 6,570,446 B1
(45) Date of Patent: May 27, 2003

(54) METHOD AND APPARATUS FOR IMPROVING THE PERFORMANCE OF ELECTRONIC DEVICES USING CROSS-DEGENERATION

(75) Inventor: Curtis Chih-shan Ling, San Diego, CA (US)

(73) Assignee: Silicon Wave, Inc., San Diego, CA (US)

(*) Notice: Subject to any disclaimer, the term of this patent is extended or adjusted under 35 U.S.C. 154(b) by 104 days.

(21) Appl. No.: 09/792,730

(22) Filed: Feb. 22, 2001

(51) Int. Cl.[7] .............................. H03F 3/45; H03F 3/30

(52) U.S. Cl. ...................... 330/252; 330/254; 330/258; 330/283

(58) Field of Search .......................... 327/359; 330/252, 330/253, 258, 254, 283

(56) References Cited

U.S. PATENT DOCUMENTS 5,729,176 A * 3/1998 Main et al. .................. 330/252
5,742,248 A * 4/1998 Voren Kamp et al. .. 330/252 X

OTHER PUBLICATIONS

Barrie Gilbert, "The Multi–tanh Principle: A Tutorial Overview", IEEE Journal of Solid–State Circuits, vol. 33, No. 1, Jan. 1998, p. 2–17.

* cited by examiner

Primary Examiner—Steven J. Mottola
(74) Attorney, Agent, or Firm—Martin J. Jaquez, Esq.; Jaquez & Associates

(57) ABSTRACT

A simple, scalable cross-degeneration circuit topology is described. The inventive cross-degeneration method and apparatus provides a circuit design having substantially improved linearity as compared to traditional circuit designs having similar power consumption. The improvement in linearity is achieved without unduly increasing circuit noise and without substantially reducing circuit bandwidth. Using the present inventive method and apparatus, a fixed circuit configuration can be used to accommodate a continuous range of specifications simply by varying component values, in contrast to the prior art requirements of providing additional devices or modifying device wiring. The inventive topology can be implemented using bipolar technologies and conventional MOS processes operating above threshold. Additionally, the inventive circuits can be implemented using other three-terminal (or multi-terminal) amplifying device technologies. A "common-mode" variant of the present inventive circuit topology is described. The common-mode variant greatly reduces noise contribution from circuit current sources.

25 Claims, 7 Drawing Sheets

Traditional (Unmodified) Hybrid Doublet Circuit

METHOD AND APPARATUS FOR IMPROVING THE PERFORMANCE OF ELECTRONIC DEVICES USING CROSS-DEGENERATION

BACKGROUND OF THE INVENTION

1. Field of the Invention

This invention relates to methods and apparatus for improving the performance of electronic devices, and more specifically to methods and apparatus using cross-degeneration techniques for improving the linearity, noise, gain and power consumption characteristics of transconductance cells, and of amplifiers, mixers, continuous-time filters and other active elements based upon such cells.

2. Description of Related Art

As is well known, linear amplification is a very important function in many electronic devices including those designed for use in signal processing applications. Under ideal conditions, the transconductance, $g_m$, of an amplifying circuit remains constant for all input values. Disadvantageously, practical amplifiers are typically implemented with devices that are fundamentally non-linear. As a consequence, the transfer functions of the non-linear devices vary greatly and depend upon the magnitude of the applied input signal. The prior art is replete with attempts at improving the performance characteristics of electronic devices using these non-linear components. Prior art circuit design techniques have been proposed that compensate for variations in the transfer functions of non-linear devices and thereby increase the input range of circuits using these devices, without also adversely affecting noise characteristics. In amplification applications, for example, prior art circuit design techniques have been proposed that compensate for these non-linearities in order to maximize the magnitude of the input signal to be amplified.

In one exemplary prior art circuit design technique, the supply current is increased in order to increase the linear range overall gain of the circuit. Using another design technique commonly referred to as "degeneration", feedback is introduced into the design of the electronic circuit in an attempt to force the overall gain of the circuit to behave in a more linear manner. Disadvantageously, this approach substantially increases noise and power consumption while reducing gain and therefore may not be attractive in applications where noise or power considerations play an important role. Another technique combines signals produced by a plurality of interconnected devices in an attempt to more precisely shape and configure the overall device transfer function to meet specific design parameters. Disadvantageously, this technique requires use of an increased number of interconnected devices to proportionally increase the input range of the device. The performance of devices made in accordance with this technique disadvantageously depends upon the precision to which the devices are matched and upon the tolerance values of each circuit element. In addition, because an increased number of devices are needed, the technique also suffers from the disadvantages of increased overall circuit area, increased circuit complexity, increased power consumption, and reduced speed. Further, the applicability of this particular prior art technique is restricted to use in bipolar device technologies and sub-threshold MOS technologies.

FIG. 1 illustrates a circuit design technique referred to as a "hybrid doublet" (HD) technique that combines degeneration with a multi-tanh signal shaping approach. A traditional Hybrid Doublet circuit 10 is shown in FIG. 1. The multi-tanh concept is a well known technique for extending the capacity of a transconductance $g_m$ cell (implemented in bipolar technologies), or an amplifier, mixer, continuous-time filter, or other active element based on such a cell, by using at least two differential transistor pairs operating in parallel. Each of the differential transistor pairs has a base offset voltage that splits the individual $g_m$ functions along the input-voltage axis. This allows the cell to process larger input voltage swings while allowing the overall transconductance of the cell to be more linear. The HD technique, and the description of the circuit 10 of FIG. 1, is described in more detail in a paper authored by Barrie Gilbert, entitled "The Multi-tanh Principle: A Tutorial Overview", published in the IEEE Journal of Solid-State Circuits, Volume 33, No. 1, in January, 1998, which is incorporated herein by reference for its teachings on HD circuit design techniques.

The HD approach exemplified in the circuit of FIG. 1 suffers from many shortcomings. For example, the HD technique does not provide for high-order derivative cancellation. As a consequence, distortion cannot be carefully controlled or reduced. Another consequence of this limitation is that third-order distortion in the HD topology does not decrease monotonically with decreasing input power. In addition, as noted above in connection with the other prior art signal shaping approaches, the HD technique relies upon a precise matching of component values given a fixed power consumption specification. This restriction fixes the gain and the input range of the circuit. This, in turn, limits a circuit designer's flexibility in tailoring the circuit for a desired application. For example, a circuit designer may wish to improve the input range and linearity of a circuit by allowing the circuit to consume more power. Disadvantageously, when selecting a topology based upon the prior art HD technique, the designer does not have this tradeoff flexibility. Thus, the components used in circuits designed in accordance with the HD approach are not easily scaleable.

Another disadvantage of the prior art HD approach is that circuit performance is quite sensitive to circuit parameters. As a consequence, variations in integrated circuit processes yield substantial degradations in signal distortion. A further disadvantage of circuits designed in accordance with the HD approach is that degeneration resistors (i.e., $R_{e1}$ 25 and $R_{e1}/A_e$ 50 of FIG. 1) result in a loss in current "headroom" in the circuit. In addition, the choice of degeneration resistor values relies upon complex empirical mathematical formulae derived from the tanh characteristics of the hybrid doublet. Disadvantageously, this significantly constrains the flexibility and usefulness of the circuit. Consequently, circuit performance tradeoffs cannot be readily designed using the prior art HD approach. Because arbitrary input signal ranges cannot be accommodated, practical circuit performance parameters such as noise, gain, and linearity are not easily implemented using the HD approach. Finally, the HD approach disadvantageously is restricted to use in bipolar technologies.

Another exemplary design technique used in the prior art in an attempt to "linearize" electronic circuits utilizes sophisticated feedback circuits having high gain characteristics. An example of such a feedback circuit is an operational amplifier feedback circuit. However, similar to the other prior art approaches described above, this approach disadvantageously substantially increases the complexity of circuit design, reduces the overall speed and bandwidth of the device, increases the circuit area required to implement the device, and does so with limited enhancement of device linearity.

Therefore, the need exists for a method and apparatus that improves the performance of electronic devices, and more specifically, that enhances the linearity of electronic devices. The need exists for a compact circuit topology that provides enhanced device linearity as compared with traditional approaches. The enhancement in linearity should be accomplished: (a) without unduly increasing noise generated by a device; (b) without substantially increasing device complexity; (c) without substantially reducing the speed or bandwidth of the device; and (d) without substantially increasing the device power consumption. The power consumed by a device using this technique should be comparable to devices using the prior art "linearization" approaches.

The method and apparatus for enhancing the linearity of electronic devices also should be easily "scaleable." That is, the circuit should be able to accommodate a wide range of circuit specifications for linearity (or input signal range), noise, gain and power consumption, without requiring modifications to its topology (e.g., modification to the number of circuit devices or their interconnection). Furthermore, the inventive method and apparatus should find application in a wide range of device technologies, including bulk CMOS processes, and in circuits having three or more current legs (or to other three-terminal (or multi-terminal transconductance) device technologies such as MOS transistors). Further, a need exists for a method and apparatus that enhances the linearity of devices and achieves the above-stated objects, yet consumes a small percentage of integrated circuit area as compared with the entire device. The present invention provides such a method and apparatus using cross-degeneration techniques. The present invention improves the linearity, noise, gain and power consumption characteristics of transconductance cells, and of amplifiers, mixers, continuous-time filters and other active elements based upon such cells. In addition, the present invention facilitates the design of circuits that are robust with respect to drifts in component values caused by process or temperature variations.

SUMMARY OF THE INVENTION

The cross-degeneration method and apparatus of the present invention improves the linearity, noise, gain and power consumption characteristics of transconductance cells, and of amplifiers, mixers, continuous-time filters and other active elements based upon such cells. The present invention provides a plurality of circuit topologies wherein cross-degeneration resistors introduce cross-degeneration between current legs of an amplifying circuit. In one exemplary embodiment, the cross-degeneration resistors provide feedback between the current legs of transistor pairs (i.e., the current provided at the emitter outputs of a first transistor pair and the current provided at the emitter outputs of a second transistor pair).

The degeneration resistors dictate the total differential transconductance $G_m$ of the inventive amplifying circuits. The differential transconductance $G_m$ of the amplifying circuits are decreased by increasing the resistance values of the degeneration resistors; the differential transconductance are increased by decreasing the resistance values of the degeneration resistors. The degeneration resistors establish the flatness or variation in the total transconductance $G_m$ as a function of the input voltage. The degeneration resistors set the flatness in the total transconductance by increasing the current diverted to an offset transistor pair. Increasing the resistance values of the degeneration resistors causes a corresponding increase in the curvature of the transconductance $G_m$ at a zero input voltage swing.

In one exemplary embodiment, the inventive circuit topology includes a pair of offset resistors. The offset resistors establish an offset between the main current and an offset current. Increasing the offset resistance decreases the curvature of the transconductance $G_m$ of the circuit at zero input swing. The third derivative of the transconductance $G_m$ can be controlled, with respect to the input voltage swing, by similarly increasing (or decreasing) the resistance values of both of the degeneration resistors and the offset resistors. The present inventive circuit uses the cross-degeneration resistors to produce a multiple-sloped transfer function for each of the current branches of the exemplary circuits. The present invention uses the cross-degenerated resistors to linearize the inventive circuit instead of relying on exponential transfer characteristics such as the tanh or degenerated-tanh transfer functions. A linear transfer function can be obtained by summing the multiple-slope transfer function of each current branch of the exemplary inventive circuits.

A "common-mode" variant of the present inventive cross-degeneration method and apparatus is provided. A motivation for the common-mode circuit topology is a desire to significantly reduce noise produced by circuit current sources. Noise attributable to the current sources is reduced by coupling the current sources to a common-mode point of the circuit. Consequently, noise produced by the current sources appears as common-mode signals only, and not as differential signals. The common-mode variant circuits of the present invention exhibit similar scalability and distortion tailoring functions as the basic cross-degeneration circuit.

The inventive topology provides a flexible, continuously-adjustable choice of input voltage ranges and gains given other constraints such as current consumption and noise. Using the present inventive method and apparatus, a wide range of input voltages and gains can be accommodated simply by varying component values, and without increasing circuit complexity or topology. Advantageously, this flexibility allows for straightforward design tradeoffs.

The details of the preferred and alternative embodiments of the present invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

Figure 1:
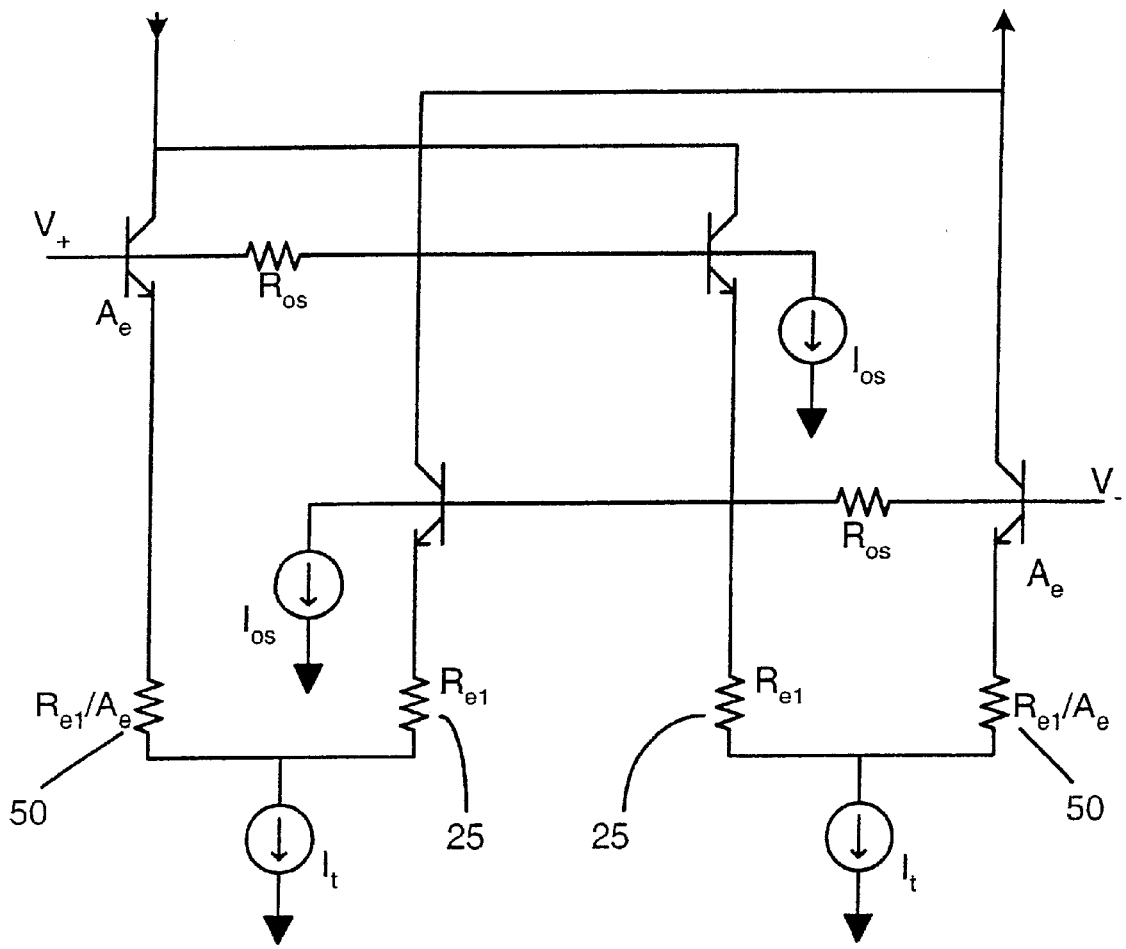
FIG. 1 shows a circuit made in accordance with a "hybrid doublet" (HD) technique that combines degeneration with a multi-tanh signal shaping approach.
Figure 2:
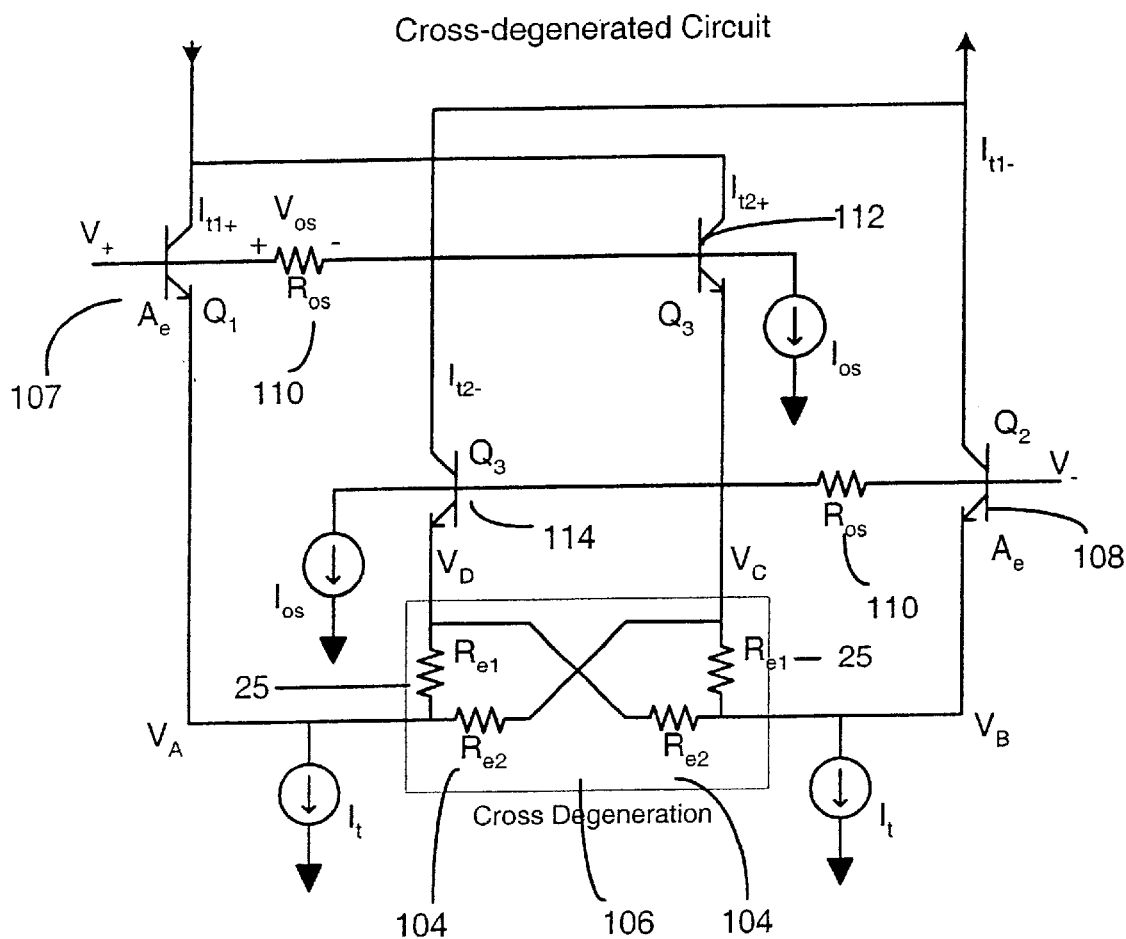
FIG. 2 shows a cross-degenerated amplifying circuit made in accordance with the present invention.

FIG. 2 shows a cross-degenerated amplifying circuit 100 made in accordance with the present invention. The topology of the circuits shown in FIGS. 1 and 2 are superficially similar to each other. For example, the degeneration resistors $R_{e1}$ 25 are present and perform a similar function to that performed in FIG. 1. However, the emitter resistors $R_{e1}/A_e$ 50 of the circuit shown in FIG. 1 are eliminated in the inventive circuit of FIG. 2. Additionally, the circuit of FIG. 2 includes cross-degeneration resistors $R_{e2}$ 104 that are not present in that of FIG. 1. The cross-degeneration resistors $R_{e2}$ 104 provide a cross-degeneration function (shown in FIG. 2 as cross-degeneration functional block 106). As described in more detail below with reference to FIGS. 3a and 3b, the cross-degeneration resistors $R_{e2}$ 104 introduce cross-degeneration between the two current legs of the amplifying circuit of FIG. 2. Specifically, and as described in more detail below, the cross-degeneration resistors $R_{e2}$ 104 provide feedback between the current legs of the transistor pairs shown in FIG. 2 (i.e., the current provided at the emitter outputs of a first transistor pair and the current provided at the emitter outputs of a second transistor pair).

Figure 3A:
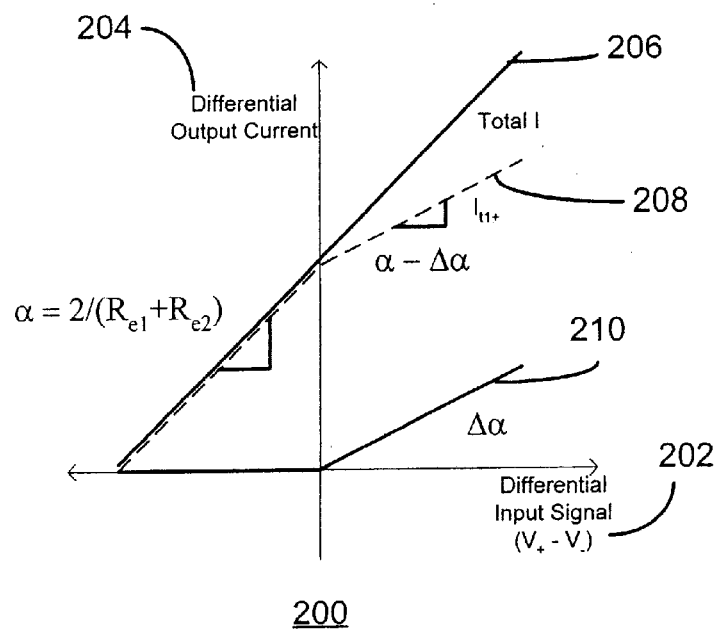
FIG. 3a is a V/I curve for the circuit of FIG. 2 showing a differential input signal plotted against a differential output current.

A qualitative description of the inventive circuit of FIG. 2 is now described with reference to FIGS. 3a and 3b. FIG. 3a is a voltage-to-current (V/I) curve 200 for the circuit of FIG. 2 showing a differential input signal ($V_+$, $V_-$) 202 plotted (along the x-axis) against a differential output current 204 (I) (along the y-axis). The total differential output current ("Total I") is shown as plot line 206, together with the differential output current of the two current legs of the circuit of FIG. 2, shown as $I_{t1+}$ 208 and $I_{t2+}$ 210, respectively. As shown in FIG. 2, the positive differential input signal $V_+$ is input to the circuit 100 at the base of a first transistor 107, while the negative differential input signal $V_-$ is input to the circuit 100 at the base of a second transistor 108. The differential output signal $I_{t1+}$ 208 is measured at the output of the first transistor 107 (at the collector output as shown in FIG. 2). Similarly, the differential output signal $I_{t2+}$ 210 is measured at the output of a third transistor, 112 (again, at the collector output of the third transistor 112 as shown in FIG. 2).

Figure 3B:
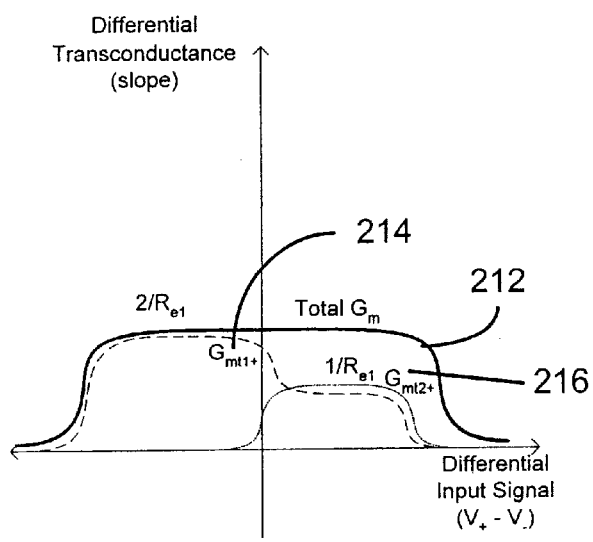
FIG. 3b shows a plot of the differential transconductance of the circuit of FIG. 2.

The differential transconductance of the circuit of FIG. 2 is shown in the plot of FIG. 3b. As is well known, the transconductance of an amplifier can be obtained by taking the derivative of the output current as a function of the input voltage. Therefore, the single-ended transconductance $G_m$ of the circuit of FIG. 2 is obtained by taking the derivative of the single-ended output current plots of FIG. 3a. Stated in another manner, the slopes of the single-ended output current plots ($I_{t1+}$ 208 and $I_{t2+}$ 210) shown in FIG. 3a produce the corresponding single-ended transconductance ($Gm_{t1+}$ 214 and $Gm_{t2+}$ 216) shown in FIG. 3b. The slope of the total single-ended output current Total I 206 produces the corresponding total single-ended transconductance $G_m$ 212 shown in FIG. 3b. One of the goals of the present invention is to increase the area of the plot of FIG. 3b where the total single-ended transconductance $G_m$ 212 is relatively constant or "flat." The linearity of the amplifier is improved by expanding this relatively constant or flat area over the entire desirable differential input range. (The single-ended transconductance is approximately related to the differential transconductance by a factor of two.)

Referring simultaneously to FIGS. 2 and 3a–3b, the degeneration resistors $R_{e1}$ 25 establish the total differential transconductance $G_m$ 212 of the inventive circuit 100 of FIG. 2. The total differential transconductance $G_m$ 212 of the circuit is decreased by increasing the resistance values of the degeneration resistors $R_{e1}$ 25. Conversely, the differential transconductance $G_m$ 212 of the circuit is increased by decreasing the resistance values of the degeneration resistors $R_{e1}$ 25. Equation 1 below provides a useful approximation for the total differential transconductance value $G_m$ of the circuit of FIG. 2:

$$G_m = 4/R_{e1} \qquad \text{Equation 1}$$

Equation 1 yields values for the total differential transconductance of the circuit of FIG. 2 that are approximately 30% to 40% lower than simulated values. However, these approximations are useful for performing "hand calculations". Another equation that can be used to approximate total differential transconductance is given in Equation 2 below:

$$G_m = 4/(R_{e1} + R_{e2}) \qquad \text{Equation 2}$$

In accordance with the present invention, both Equations 1 and 2 can be used to efficiently approximate the total differential transconductance value $G_m$ of the circuit of FIG. 2.

The degeneration resistors $R_{e2}$ 104 establish the flatness or variation in the total transconductance $G_m$ of the circuit as a function of the input voltage ($V_+$, $V_-$) 202. The degeneration resistors set the flatness in the total transconductance by increasing the current that is diverted to the offset transistor pair. Increasing the resistance values of the degeneration resistors $R_{e2}$ 104 causes an increase in the curvature of the transconductance $G_m$ at a zero input voltage swing.

The circuit shown in FIG. 2 also includes a pair of offset resistors $R_{OS}$ 110. In one embodiment, the offset resistors $R_{OS}$ 110 are coupled to the respective bases of the transistors 107, 108 as shown. For example, a first offset resistor 110 is coupled between the transistor 107 and a third transistor 112 as shown in FIG. 2. Similarly, a second offset resistor 110 is coupled between the transistor 108 and a fourth transistor 114 as shown. The pair of offset resistors $R_{OS}$ 110 establish an offset between the main current and an offset current in the circuit. Increasing the offset resistance decreases the curvature of the transconductance $G_m$ of the circuit of FIG. 2 at zero input swing. The third derivative of the transconductance $G_m$ of the circuit of FIG. 2 can be controlled, with respect to the input voltage swing, by similarly increasing (or decreasing) the resistance values of both of the degeneration resistors $R_{e2}$ 104 and the offset resistors $R_{OS}$ 110. Stated another way, the third derivative of the transconductance $G_m$ can be controlled by varying the values of both the degeneration resistors $R_{e2}$ 104 and the offset resistors $R_{OS}$ 110 in the same direction. In accordance with one exemplary embodiment, the third derivative is controlled by varying either the degeneration or offset resistors. The resistance values may be selected such that the third derivative remains largely invariant with respect to the absolute values of the resistors throughout a relatively wide range of values (e.g., plus or minus twenty percent).

Advantageously, the present inventive circuit uses the cross-coupled resistors (e.g., the cross-degeneration functional block 106) to produce a multiple-sloped transfer function for each of the current branches. The present invention uses the cross-coupled resistors to linearize the inventive circuit instead of relying on exponential transfer characteristics such as the tanh or degenerated-tanh transfer functions. A linear transfer function can be obtained by summing the multiple-slope transfer function of each current branch of the circuit 100 of FIG. 2. An ideal form of the obtained linear transfer function is shown in FIGS. 3a and 3b.

The balanced nature of the inventive circuit 100 of FIG. 2 results in a total current having a slope that tends to remain constant over the input signal range. Essentially the inventive circuit 100 reduces the swing across which the currents balance each other to result in a constant-slope current-vs.-voltage (i.e.,.transconductance) curve.

Figure 4:
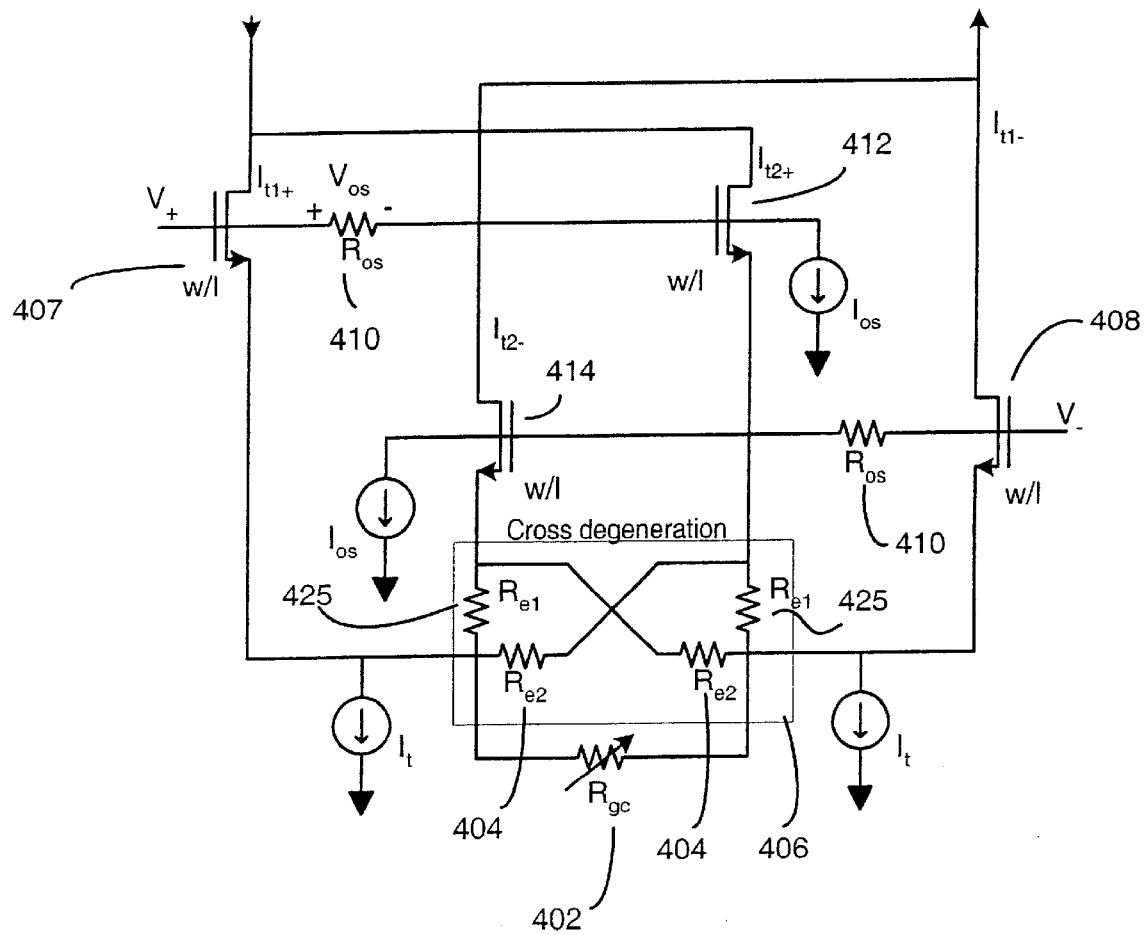
FIG. 4 shows a cross-degenerated MOS-based circuit made in accordance with the present invention.

In another embodiment, the present invention can be extended to other three-terminal devices (or multi-terminal transconductance devices) such as MOS transistors. Strictly speaking, MOS transistors comprise four-terminal devices, however, typically, only three of the four terminals are used in a practical implementation. FIG. 4 shows a cross-degenerated MOS-based circuit 400 made in accordance with the present invention. The embodiment shown in FIG. 4 shows the MOS-based circuit 400 including a gain-control resistor $R_{gc}$ 402. The gain-control resistor $R_{gc}$ 402 is straddled across the cross-degeneration resistors to control the overall gain of the circuit 400. Alternatively, the degeneration resistors $R_{e1}$ can be varied to control the circuit gain associated with gradual degradation or increase in linearity of the circuit.

The remainder of the inventive circuit 400 shown in FIG. 4 operates similarly to the description of the operation of the circuit 100 of FIG. 2. For example, similar to the circuit 100 of FIG. 2, the inventive cross-degenerated MOS-based circuit 400 includes a cross-degeneration functional block 406 including a pair of degeneration resistors $R_{e1}$ 425 coupled to a pair of cross-degeneration resistors $R_{e2}$ 404. The cross-degeneration resistors $R_{e2}$ 404 provide feedback between the current legs of the transistor pairs shown in FIG. 4. As shown in FIG. 4, the positive differential input signal $V_+$ is input to the circuit 400 at the gate of a first MOS transistor 407, while the negative differential input signal $V_-$ is input to the circuit 400 at the gate of a second MOS transistor 408. The differential output signal $I_{t1+}$ is measured at the output of the first MOS transistor 407. Similarly, the differential output signal $I_{t2+}$ is measured at the output of a third MOS transistor, 412.

The differential transconductance $G_m$ of the circuit 400 of FIG. 4 is obtained by taking the derivative of the differential output current plots. The degeneration resistors $R_{e1}$ 425 establish the total differential transconductance $G_m$ of the inventive circuit 400 of FIG. 4. The total differential transconductance $G_m$ of the circuit 400 is decreased by increasing the resistance values of the degeneration resistors $R_{e1}$ 425. Conversely, the differential transconductance $G_m$ of the circuit 400 is increased by decreasing the resistance values of the degeneration resistors $R_{e1}$ 425. The degeneration resistors $R_{e2}$ 404 establish the flatness or variation in the total transconductance $G_m$ of the circuit as a function of the input voltage ($V_+$, $V_-$). The degeneration resistors set the flatness in the total transconductance by increasing the current that is diverted to the offset transistor pair. Increasing the resistance values of the degeneration resistors $R_{e2}$ 404 causes an increase in the curvature of the transconductance $G_m$ at a zero input voltage swing.

Referring again to FIG. 4, the inventive MOS-based circuit 400 also includes a pair of offset resistors. $R_{O5}$ 410.

In one embodiment, the offset resistors $R_{O5}$ 410 are coupled to the respective gates of the MOS transistors 407, 408 as shown. For example, a first offset resistor 410 is coupled between the transistor 407 and a third transistor 412 as shown in FIG. 4. Similarly, a second offset resistor 410 is coupled between the transistor 408 and a fourth transistor 414 as shown in FIG. 4. As described above with reference to the offset resistors $R_{O5}$ 110 of FIG. 2, the pair of offset resistors $R_{O5}$ 410 establishes an offset between the main current and an offset current in the inventive circuit 400. Increasing the offset resistance decreases the curvature of the transconductance $G_m$ of the circuit of FIG. 4 at zero input swing. The third derivative of the transconductance $G_m$ can be controlled, with respect to the input voltage swing, by similarly increasing (or decreasing) the resistance values of both of the degeneration resistors $R_{e2}$ 404 and the offset resistors $R_{O5}$ 410.

As described above with reference to FIG. 2, advantageously, the present inventive circuit 400 uses the cross-coupled resistors (e.g., the cross-degeneration functional block 406) to produce a multiple-sloped transfer function for each of the current branches. As described above with reference to FIG. 2, the inventive circuit 400 uses the cross-coupled resistors for linearization purposes, instead of relying on exponential transfer characteristics such as the tanh or degenerated-tanh transfer functions. Similar to the circuit described above with reference to FIG. 2, a linear transfer function is obtained by summing the multiple-slope transfer function of each current branch of the circuit 400 of FIG. 4.

Figure 5:
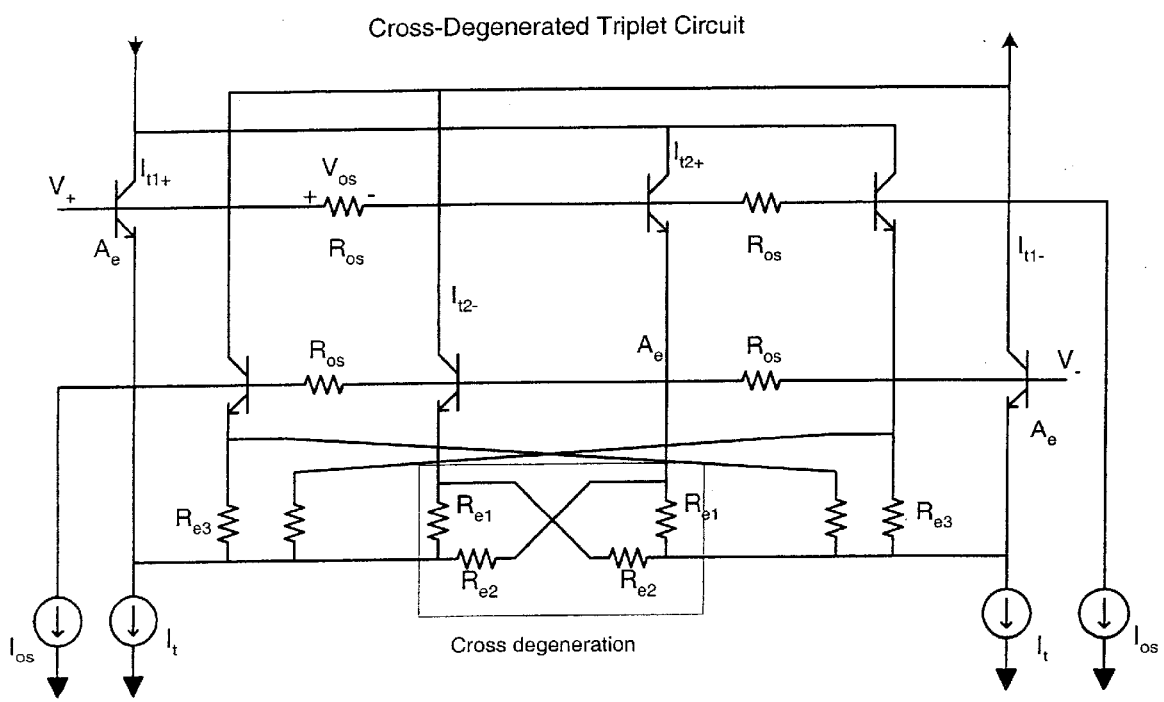
FIG. 5 shows an embodiment of the present inventive method and apparatus wherein the cross-degeneration approach is extended to a cross-degenerated "triplet" circuit.

The inventive cross-degeneration method and apparatus can be applied in a straightforward manner to circuits that have three or more current legs. FIG. 5 shows an embodiment of the present inventive method and apparatus wherein the cross-degeneration approach is extended to a cross-degenerated "triplet" circuit 500. Note that this circuit obviates the need for an additional current source used to support the additional differential transistor pair. The addition of more offset differential pairs provides a circuit designer with a means for extending the percentage of input range over which the transconductance cell is linear without significantly increasing power or reducing gain, at the expense of complexity and component matching issues. Thus, the efficiency of the circuit is improved.

Figure 6A:
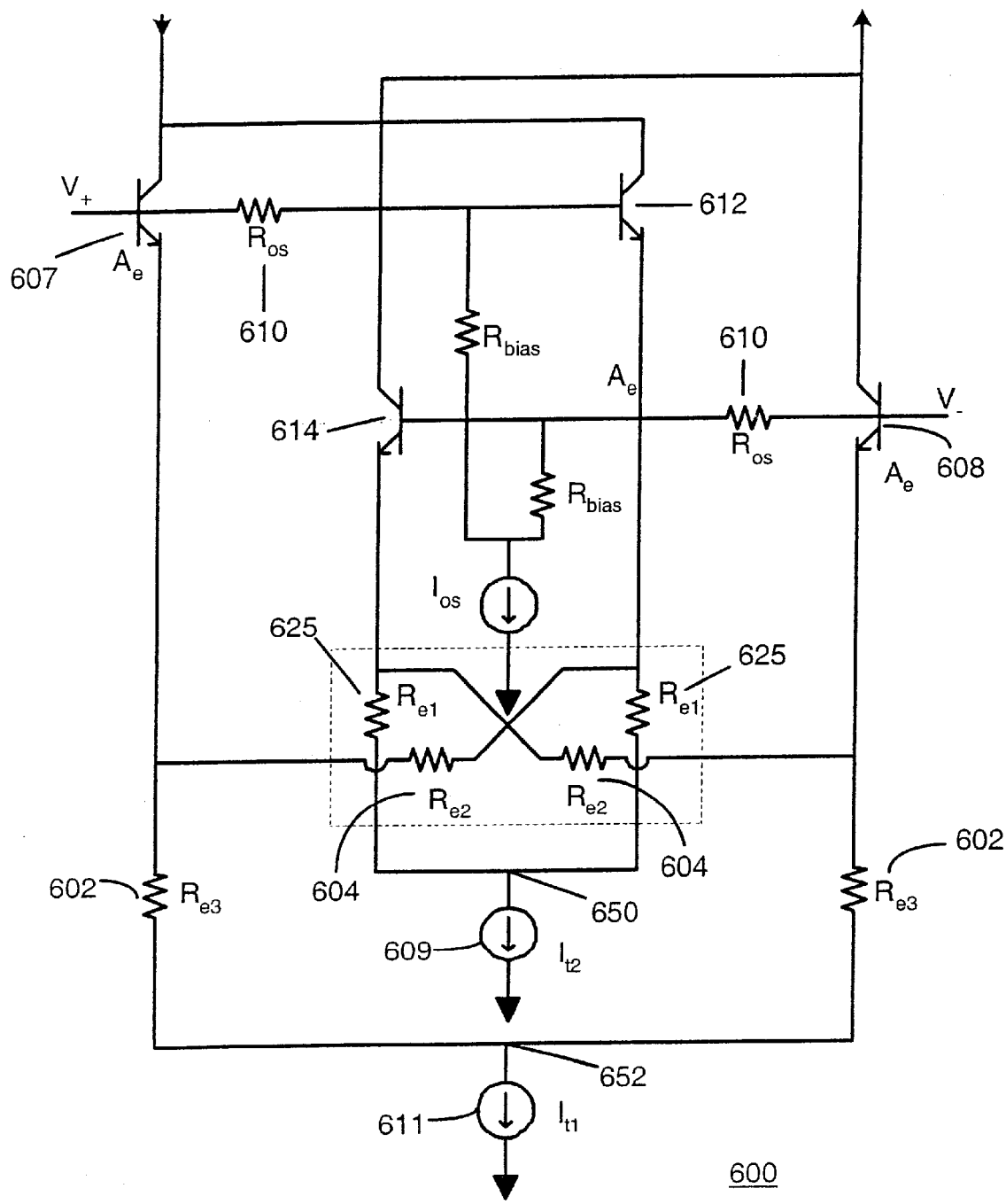
FIG. 6a shows a first exemplary common-mode variant of the cross degeneration method and apparatus of the present invention.

Another significant variant of the cross degeneration method and apparatus of the present invention is application to a "common-mode" design. One such embodiment is exemplified in the circuit 600 of FIG. 6a. A significant motivation for this circuit topology is the desire to significantly reduce noise that is contributed by the current sources $I_t$ (see, for example, FIGS. 1, 2, 4 and 5). Noise that is contributed by the current sources $I_t$ can be significantly reduced by applying the cross-degeneration method and apparatus to a circuit that positions the current sources at common-mode points (i.e., to virtual grounds). Consequently, any noise produced by the current sources appears as common-mode signals only, and not as differential signals. The current sources are redistributed into two sources $I_{t1}$ 611 and $I_{t2}$ 609. As shown in FIG. 6a, the current sources 609, 611 are coupled to the circuit 600 at virtual ground points 650, 652, respectively.

In accordance with this embodiment, an additional pair of resistors $R_{e3}$ 602 are connected to the current source $I_{t1}$ 611 at the virtual ground point 652. The circuit 600 also includes the resistors $R_{e1}$ 625 connected to the current source $I_{t2}$ 609 at the virtual ground point 650. As described in more detail below, the resistors $R_{e3}$ 602 and $R_{e1}$ 625 are used to establish the transconductance $G_m$ of the circuit 600. Because the resistors $R_{e3}$ 602 and $R_{e1}$ 625 are coupled to virtual ground points (i.e., the ground points 650, 652), the resistors can be readily modulated (i.e., the resistance values associated with the resistors $R_{e3}$ 602 and $R_{e1}$ 625 can be readily implemented) with transistors. Stated in another manner, because the voltages at the virtual ground points 650, 652 are signal-independent, the transconductance $G_m$ of the circuit 600 can be easily established using constant gate control voltages on transistors used to implement (i.e., used to "modulate", or control the resistance values of) the resistors $R_{e3}$ 602 and $R_{e1}$ 625. This is a very useful feature when the circuit 600 is used in variable gain amplifiers.

These current sources can take on varying values. The common-mode variant circuit 600 of FIG. 6a exhibits similar scalability and distortion tailoring functions as the basic cross-degeneration circuit 100 of FIG. 2, though the resistors play somewhat different roles. Because the resistors $R_{e3}$ 602 and $R_{e1}$ 625 are connected in series with a DC current path, a finite amount of voltage drop exists across the resistors. This reduces the amount of voltage available for amplification. This is implicit in applying degeneration in a differential pair with a common tail current. Owing to practical circuit implementation issues, little if any headroom is lost when comparing the circuits of FIGS. 2 and 6.

With the exception of the noise reduction obtained by using the current source placement described above, the common-mode variant of the present cross-degeneration method and apparatus shown in FIG. 6a operates similarly to the other cross-degeneration circuits described above with reference to FIGS. 2, 4 and 5. For example, as shown in FIG. 6a, the common-mode variant circuit 600 includes a cross-degeneration functional block 606 including a pair of degeneration resistors $R_{e1}$ 625 coupled to a pair of cross-degeneration resistors $R_{e2}$ 604. The cross-degeneration resistors $R_{e2}$ 604 provide feedback between the current legs of the transistor pairs shown in FIG. 6a. As shown in FIG. 6a, the positive differential input signal $V_+$ is input to the circuit 600 at the base of a first transistor 607, while the negative differential input signal $V_-$ is input to the circuit 600 at the base of a second transistor 608.

Similar to the inventive circuits of FIGS. 2, 4 and 5, the common-mode variant 600 of FIG. 6a also includes a pair of offset resistors $R_{O5}$ 610. In the embodiment shown in FIG. 6a, the offset resistors $R_{O5}$ 610 are coupled to the respective bases of the transistors 607, 608 as shown. For example, a first offset resistor 610 is coupled between the transistor 607 and a third transistor 612 as shown in FIG. 6a. Similarly, a second offset resistor 610 is coupled between the transistor 608 and a fourth transistor 614 as shown in FIG. 6a. As described above with reference to the offset resistors $R_{O5}$ 110 of FIG. 2, the pair of offset resistors $R_{O5}$ 610 establishes an offset between the main current and an offset current in the inventive circuit 600. Increasing the offset resistance decreases the curvature of the transconductance $G_m$ of the circuit of FIG. 6a at zero input swing. The third derivative of the transconductance $G_m$ can be controlled, with respect to the input voltage swing, by similarly increasing (or decreasing) the resistance values of both of the degeneration resistors $R_{e2}$ 604 and the offset resistors $R_{O5}$ 610. The resistors $R_{e3}$ 602 and $R_{e1}$ 625 establish the overall gain of the inventive circuit 600 (the pair of resistors $R_{e3}$ 602 is more dominant in this regard). The resistors $R_{e2}$ 604, $R_{e1}$ 625 and the offset resistor $R_{O5}$ 610 are used to establish the curvature of the transconductance curve as described above with reference to FIG. 2.

Figure 6B:
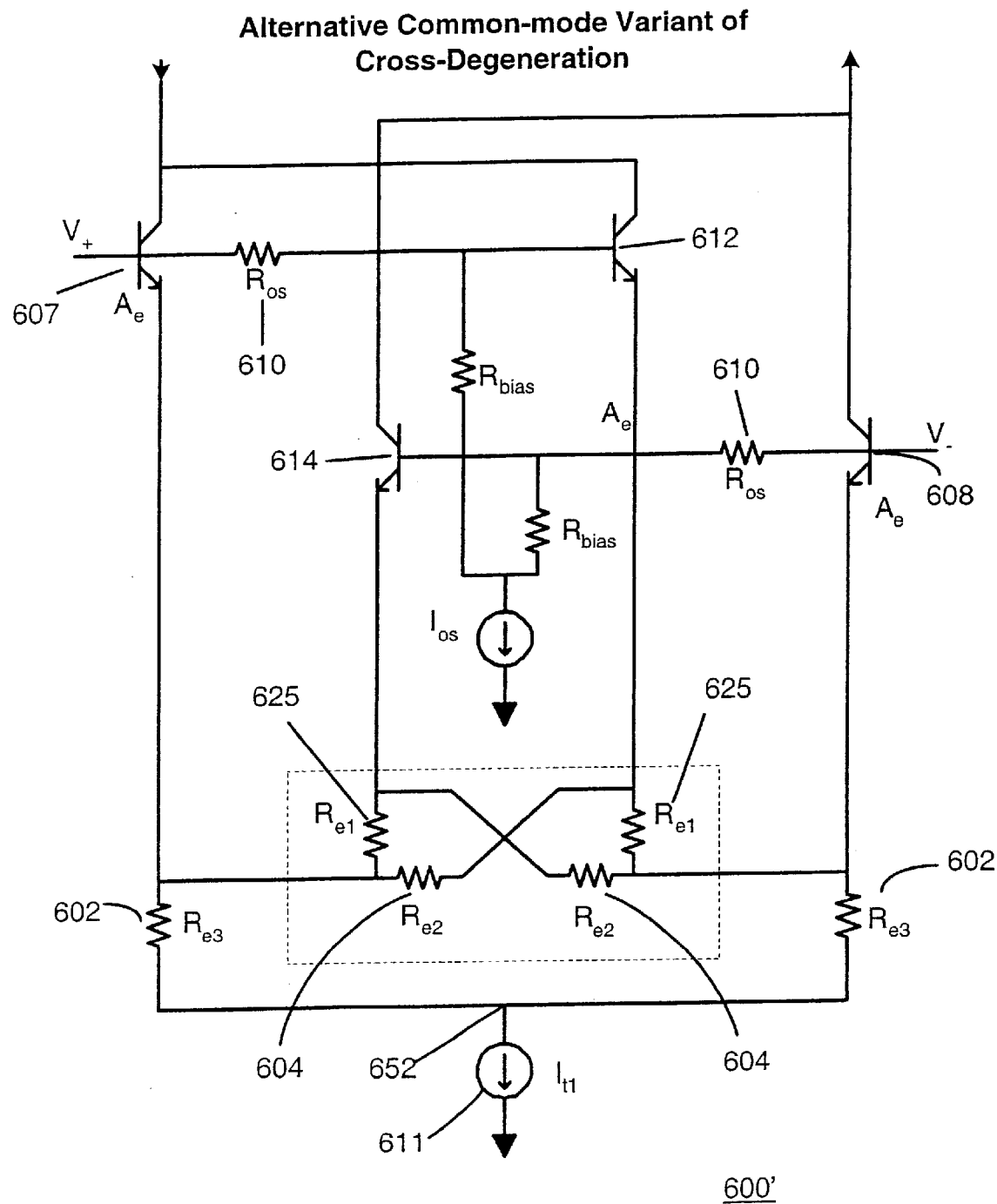
FIG. 6b shows a second exemplary common-mode variant of the cross degeneration method and apparatus of the present invention.

FIG. 6b shows a second exemplary common-mode variant of the cross degeneration method and apparatus of the present invention. The commode-variant circuit 600' of FIG. 6b is very similar to that of FIG. 6a. However, advantageously, the current source $I_{t2}$ 609 of the circuit 600 of FIG. 6a is eliminated from the circuit 600' of FIG. 6b. This circuit topology has an advantage of merely requiring use of a single tail current source ($I_{t1}$), which consequently reduces integrated circuit area required for the circuit, and also simplifies the layout of the circuit. The resistors $R_{e2}$ 604 and $R_{e3}$ 602 function to control the overall gain $G_m$ of the circuit 600', while the resistors $R_{e1}$ 625 and $R_{O5}$ 610 establish the transconductance curvature ($G_m^3$) of the circuit 600'.

In terms of design parameters, both of the common-mode circuits of FIGS. 6a and 6b have four degrees of freedom. The common-mode circuits typically have two design constraints, transconductance $G_m$, and transconductance curvature ($G_m^3$). Advantageously, resistor values can be tailored to satisfy the design constraints while also keeping the transconductance curvature ($G_m^3$) of the circuit constant (i.e., approximately equal to zero) as the absolute value of the resistance values change. Changes to the transconductance curvature ($G_m^3$) of the circuit caused by the resistors $R_{e1}$ 625 and $R_{O5}$ 610 are offset by those caused by the resistors $R_{e2}$ 604 and $R_{e3}$ 602. Table 1 below shows how the gain (transconductance ($G_m$)) and transconductance curvature ($G_m^3$) of the common-mode embodiments vary as a function of an increase to the absolute resistance values if the resistors $R_{e1}$ 625, $R_{e2}$ 604, $R_{e3}$ 602, and $R_{O5}$ 610.

TABLE 1

Gain and Curvature Variations as a function of Increased Absolute Resistance Values for the Common-mode Embodiments

| Increased Resistor Value | $G_m$ | $G_m^3$ (3rd derivative of Gm = Curvature) |
|---|---|---|
| $R_{e1}$ (+) | − | − |
| $R_{e2}$ (+) | − | + |
| $R_{e3}$ (+) | − | + |
| $R_{os}$ (+) | − | − |

A negative or minus "−" indication in the Table indicates that the design constraint decreases as the absolute value of the resistance is increased. In contrast, a positive or plus "+" indication in the Table indicates that the design constraint increases as the absolute value of the resistance is increased.

SUMMARY

A simple, scalable cross-degeneration circuit topology has been described. The inventive cross-degeneration method and apparatus provides a circuit design having substantially improved linearity as compared to traditional circuit designs having similar power consumption. The improvement in linearity is achieved without unduly increasing circuit noise and without substantially reducing circuit bandwidth. Using the present inventive method and apparatus, a fixed circuit configuration can be used to accommodate a continuous range of specifications simply by varying component values, in contrast to the prior art requirements of providing additional devices or modifying device wiring.

The present inventive circuit effectively cancels any higher-order non-linearities in the transfer characteristics of the circuit. Using current levels similar to those used in traditional circuit design approaches, the present invention offers substantially-increased input range without the need for a large number of circuit devices. The topology of the inventive circuit facilitates a shaping of not only the transconductance of a circuit but also the higher-order derivatives, allowing a substantial reduction of distortion products.

The topology provides a flexible, continuously-adjustable choice of input voltage ranges and gains given other constraints such as current consumption and noise (or vice versa). Using the present inventive method and apparatus, a wide range of input voltages and gains can be accommodated simply by varying component values, and without increasing circuit complexity or topology. Advantageously, this flexibility allows for straightforward design tradeoffs. This is an important characteristic of useable circuit topologies.

The circuits described above are robust with respect to device matching and circuit element values. While the circuits described above can be easily implemented in an integrated circuit, those skilled in the circuit design arts shall recognize that alternative implementations are also possible. The inventive topology can be easily implemented using bipolar technologies. However, the inventive topology also lends itself to implementation using conventional MOS processes operating above threshold. Additionally, the inventive circuits described above can be implemented using other three-terminal (or multi-terminal) amplifying device technologies. For example, these devices may include MOS transistors, MESFET and HEMT transistors using metal-on-semiconductor junctions, and the JFET transistors.] Advantageously, owing to the exponential device transfer characteristics of bipolar devices, the present invention can be used in bulk CMOS processes that are both inexpensive and widely available.

The gains of the inventive circuits are reliably and easily controlled. Owing to the inventive topology of the circuits described above, gain is controllable simply by scaling a single resistor. Another advantage provided by the present invention concerns reduced circuit noise. The noise associated with the present circuit configuration is superior to conventionally-degenerated circuit designs because the cross-degeneration operates with effectively dynamically-changing degeneration across the input swing. Stated in another way, less degeneration is used at low swings than is used at the higher swing ranges, thereby introducing less noise under conditions where low noise is desired (i.e., at small signal levels). Reduced degeneration is required with the present invention in order to achieve a given level of linearity.

A number of embodiments of the present invention have been described. Nevertheless, it will be understood that various modifications may be made without departing from the spirit and scope of the invention. Although specific embodiments of the present inventive method and apparatus have been described with reference to the circuits of FIGS. 2, 4, 5 and 6, alternative topologies and circuit designs can be used without departing from the scope of the present invention. For example, the present invention can find application in circuits using N differential pairs, wherein N is greater than 3. In addition, the present invention can be used to implement any device wherein a feedback signal path can be provided between the main and offset differential pairs, and wherein the current outputs can be combined to achieve a linear transfer function. Accordingly, it is to be understood that the invention is not to be limited by the specific illustrated embodiment, but only by the scope of the appended claims.

What is claimed is:

1. A cross-degenerated amplifying circuit, including:
a) a first differential transistor pair configured to receive a differential input signal, wherein the first differential transistor pair includes a first current leg of the amplifying circuit;
b) a second differential transistor pair configured to receive the differential input signal, wherein the second differential transistor pair includes a second current leg of the amplifying circuit;
c) a first pair of degeneration resistors coupled in serial to the first and second current legs of the amplifying circuit; and
d) a first pair of cross-degeneration resistors coupled between the first and second current legs, wherein the cross-degeneration resistors induce cross-degeneration between the first and second current legs of the amplifying circuit.

2. The cross-degenerated amplifying circuit as defined in claim 1, wherein the first and second differential transistor pairs comprise differential pairs of bipolar transistors having associated and corresponding inputs and outputs connected in a parallel configuration.

3. The cross-degenerated amplifying circuit as defined in claim 1, wherein the first and second differential transistor pairs comprise differential pairs of MOS-FET transistors having inputs and outputs are connected in a parallel configuration.

4. The cross-degenerated amplifying circuit as defined in claim 1, wherein the amplifying circuit has a total differential transconductance of $G_m$, and wherein the total differential transconductance $G_m$ is determined by the degeneration resistors.

5. The cross-degenerated amplifying circuit as defined in claim 4, wherein the total differential transconductance $G_m$ is decreased by increasing resistance values of the degeneration resistors, and wherein the differential transconductance $G_m$ is increased by decreasing resistance values of the degeneration resistors.

6. The cross-degenerated amplifying circuit as defined in claim 5, wherein the total differential transconductance $G_m$ is approximated in accordance with the following equation:

$$G_m = 4/R_{e1};$$

and wherein $R_{e1}$ comprises the resistance value of the degeneration resistors.

7. The cross-degenerated amplifying circuit as defined in claim 5, wherein the total differential transconductance $G_m$ is approximated in accordance with the following equation:

$$G_m = 4/(R_{e1} + R_{e2});$$

and wherein $R_{e1}$ comprises the resistance value of the degeneration resistors, and wherein $R_{e2}$ comprises the resistance value of the cross-degeneration resistors.

8. The cross-degenerated amplifying circuit as defined in claim 4, wherein the degeneration resistors control the flatness and variation in the total differential transconductance $G_m$ of the circuit as a function of the input signal.

9. The cross-degenerated amplifying circuit as defined in claim 8, wherein an increase in the resistance values of the degeneration resistors causes a corresponding increase in the curvature of the differential transconductance $G_m$ at a zero input signal swing.

10. The cross-degenerated amplifying circuit as defined in claim 1, further including a pair of offset resistors coupled in serial between the first and second differential transistor pairs, wherein the offset resistors establish an offset between a first main current and an offset current of the circuit.

11. The cross-degenerated amplifying circuit as defined in claim 10, wherein an increase in the resistance values of the offset resistors causes a corresponding decrease in the curvature of the differential transconductance $G_m$ at a zero input signal swing.

12. The cross-degenerated amplifying circuit as defined in claim 10, wherein a third derivative of the differential transconductance $G_m$ of the circuit is controlled with respect to the input signal swing by varying the resistance values of both the degeneration resistors and the offset resistors.

13. The cross-degenerated amplifying circuit as defined in claim 12, wherein the third derivative of the differential transconductance $G_m$ of the circuit is controlled by varying the resistance values of both the degeneration resistors and the offset resistors in the same direction of variation.

14. The cross-degenerated amplifying circuit as defined in claim 1, wherein a linear transfer function for the circuit is obtained by summing multiple-slope transfer functions of each current leg of the circuit.

15. The cross-degenerated amplifying circuit as defined in claim 14, wherein a total current produced by the current legs of the circuit has a slope that remains approximately constant over a range of input signals.

16. The cross-degenerated amplifying circuit as defined in claim 1, further including:
   a) a third differential transistor pair connected in parallel to the first and second differential transistor pairs, wherein the third differential transistor pair includes a third and fourth current legs of the amplifying circuit;
   b) a second pair of degeneration resistors coupled in serial to the third the fourth current legs of the amplifying circuit; and
   c) a second pair of cross-degeneration resistors coupled between the third and the fourth current legs, wherein the cross-degeneration resistors induce cross-degeneration between the third and the fourth current legs of the amplifying circuit.

17. A common-mode cross-degenerated amplifying circuit, including:
   a) a first differential transistor pair configured to receive a differential input signal, wherein the first differential transistor pair includes a first current leg of the amplifying circuit;
   b) a second differential transistor pair configured to receive the differential input signal, wherein the second differential transistor pair includes a second current leg of the amplifying circuit;
   c) a first pair of degeneration resistors coupled in serial to the first and second current legs of the amplifying circuit;
   d) a first pair of cross-degeneration resistors coupled between the first and second current legs, wherein the cross-degeneration resistors induce cross-degeneration between the first and second current legs of the amplifying circuit;
   e) a first current source serially connected to the first pair of degeneration resistors;
   f) a second pair of cross-degeneration resistors coupled in serial to the first pair of cross-degeneration resistors; and
   g) a second current source serially connected to the second pair of cross-degeneration resistors, wherein noise contributed by the first and second current sources appears as common-mode signals.

18. A method of improving the linearity of an electronic circuit comprising the steps of:
   a) receiving a differential input signal;
   b) inputting the received signal to a first differential transistor pair, wherein the first differential transistor pair includes a first current leg of an electronic circuit;
   c) inputting the received signal to a second differential transistor pair, wherein the second differential transistor pair includes a second current leg of the electronic circuit; and
   d) inducing cross-degeneration between the first and second current legs of the circuit by connecting cross-degeneration resistors between the first and second current legs.

19. The method of improving the linearity of an electronic circuit as set forth in claim 18, wherein the electronic circuit is a mixer.

20. The method of improving the linearity of an electronic circuit as set forth in claim 18, wherein the electronic circuit is a continuous-time filter.

21. An apparatus improving the linearity of an electronic circuit comprising:
   a) means for receiving a differential input signal;
   b) means, coupled to the receiving means, for inputting the received signal to a first differential transistor pair, wherein the first differential transistor pair includes a first current leg of an electronic circuit;
   c) means, coupled to the first inputting means, for inputting the received signal to a second differential transistor pair, wherein the second differential transistor pair includes a second current leg of the electronic circuit; and
   d) means for inducing cross-degeneration between the first and second current legs of the circuit by connecting cross-degeneration resistors between the first and second current legs.

22. A common-mode cross-degenerated amplifying circuit, including:
   a) a first differential transistor pair configured to receive a differential input signal, wherein the first differential transistor pair includes a first current leg of the amplifying circuit;
   b) a second differential transistor pair configured to receive the differential input signal, wherein the second differential transistor pair includes a second current leg of the amplifying circuit;
   c) a first pair of degeneration resistors coupled in serial to the first and second current legs of the amplifying circuit;
   d) a first pair of cross-degeneration resistors coupled between the first and second current legs, wherein the cross-degeneration resistors induce cross-degeneration between the first and second current legs of the amplifying circuit;
   e) a second pair of cross-degeneration resistors coupled in serial to the first pair of cross-degeneration resistors; and
   f) a current source serially connected to the second pair of cross-degeneration resistors, wherein noise contributed by the current source appears as common-mode signals.

23. The common-mode cross-degenerated amplifying circuit of claim 22, wherein the cross-degeneration resistors control an overall gain $G_m$ of the circuit.

24. The common-mode cross-degenerated amplifying circuit of claim 22, further including a pair of offset resistors $R_{OS}$ coupled in serial between the first and second differential transistor pairs, wherein the first pair of degeneration resistors and the offset resistors establish a transconductance curvature ($G_m^3$) of the amplifying circuit.

25. The common-mode cross-degenerated amplifying circuit of claim 24, wherein variations in the transconductance curvature ($G_m^3$) of the amplifying circuit caused by the degeneration and offset resistors are offset by variations in the transconductance curvature ($G_m^3$) of the amplifying circuit caused by the cross-degeneration resistors.

* * * * *